Figure 1:
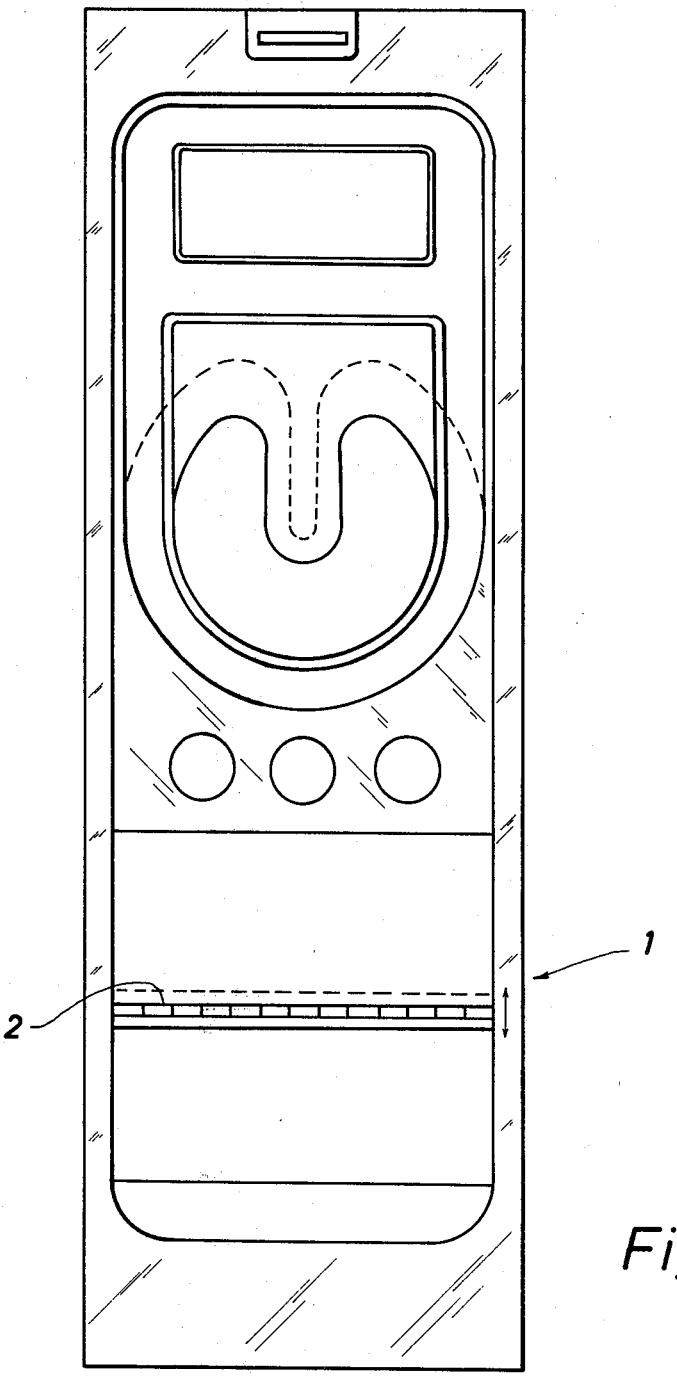

United States Patent [19]

Norgaard et al.

[11] 4,378,157
[45] Mar. 29, 1983

[54] METHOD OF CONTROLLING THE CONTRAST BY REPRODUCTION SUCH AS SCREEN REPRODUCTION

[75] Inventors: Richardt Norgaard, Ballerup; Vagn N. Rasmussen, Gentofte, both of Denmark

[73] Assignee: Eskofot A/S, Ballerup, Denmark

[21] Appl. No.: 251,047

[22] Filed: Apr. 6, 1981

[30] Foreign Application Priority Data

Apr. 15, 1980 [DK] Denmark .............................. 1592/80

[51] Int. Cl.$^3$ ............................................. G03B 27/32
[52] U.S. Cl. ......................................... 355/77; 355/71
[58] Field of Search .................................. 355/67–71, 355/77

[56] References Cited

U.S. PATENT DOCUMENTS

| | | | |
|---|---|---|---|
| 3,249,000 | 5/1966 | Pack ............................ | 355/70 X |
| 3,545,858 | 12/1970 | Childers ....................... | 355/68 |
| 3,619,055 | 11/1971 | Archer et al. ................. | 355/70 X |
| 3,868,183 | 2/1975 | Childers ....................... | 355/68 |
| 3,874,793 | 4/1975 | Nielsen ........................ | 355/68 |

*Primary Examiner*—Richard A. Wintercorn
*Attorney, Agent, or Firm*—Michael Ebert

[57] ABSTRACT

A method of controlling the contrast by reproduction such as screen reproduction, e.g. screen reproduction of halftone pictures by means of a main exposure and an auxiliary exposure, whereby the density both in the lightest and in the darkest field of the picture and consequently the contrast range of the halftone picture are first measured by means of a densitometer, whereafter the ratio of the lightest spot of the background chosen to the lightest spot of the original is measured and the main exposure is adjusted in response thereto. According to the invention a slider is on the basis of the screen range adjusted in a table indicating the flash percentage versus the screen range and the image range, whereby the flash percentage is automatically measured on the basis of a signal value corresponding to the image range. In this manner references to tables are avoided without using calculating units.

2 Claims, 2 Drawing Figures

Contrast range of original

| Contrast range of screen \ | 8 | 9 | 10 | 11 | 12 | 13 | 14 | 15 | 16 | 17 | 18 | 19 | 20 |
|---|---|---|---|---|---|---|---|---|---|---|---|---|---|
| 7 | 5 | 8,5 | 11 | 13 | 14,5 | 15,5 | 16,5 | 17,5 | 18 | 18,5 | 18,5 | 19 | 19 |
| 8 | | 3,5 | 6,5 | 8,5 | 10 | 11,5 | 12,5 | 13 | 13,5 | 14 | 14,5 | 15 | 15 |
| 9 | | | 3 | 5 | 5,5 | 8 | 9 | 9,5 | 10,5 | 11 | 11 | 11,5 | 11,5 |
| 10 | | | | 2 | 4 | 5,5 | 6,5 | 7 | 7,5 | 8 | 8,5 | 9 | 9 |
| 11 | | | | | 1,5 | 3 | 4 | 5 | 5,5 | 6 | 6,5 | 7 | 7 |
| 12 | | | | | | 1,5 | 2,5 | 3,5 | 4 | 4,5 | 5 | 5 | 5,5 |
| 13 | | | | | | | 1 | 2 | 2,5 | 3 | 3,5 | 4 | 4 |
| 14 | | | | | | | | 1 | 1,5 | 2 | 2,5 | 3 | 3 |
| 15 | | | | | | | | | 0,5 | 1 | 1,5 | 2 | 2 |
| 16 | | | | | | | | | | 0,5 | 1 | 1,5 | 1,5 |

Flash %

|  | Contrast range of original | | | | | | | | | | | | |
|---|---|---|---|---|---|---|---|---|---|---|---|---|---|
| Contrast range of screen | | 8 | 9 | 10 | 11 | 12 | 13 | 14 | 15 | 16 | 17 | 18 | 19 | 20 |
| | 7 | 5 | 8,5 | 11 | 13 | 14,5 | 15,5 | 16,5 | 17,5 | 18 | 18,5 | 18,5 | 19 | 19 |
| | 8 | | 3,5 | 6,5 | 8,5 | 10 | 11,5 | 12,5 | 13 | 13,5 | 14 | 14,5 | 15 | 15 |
| | 9 | | | 3 | 5 | 5,5 | 8 | 9 | 9,5 | 10,5 | 11 | 11 | 11,5 | 11,5 |
| | 10 | | | | 2 | 4 | 5,5 | 6,5 | 7 | 7,5 | 8 | 8,5 | 9 | 9 |
| | 11 | | | | | 1,5 | 3 | 4 | 5 | 5,5 | 6 | 6,5 | 7 | 7 |
| | 12 | | | | | 1,5 | 2,5 | 3,5 | 4 | 4,5 | 5 | 5 | 5,5 |
| | 13 | | | | | | | 1 | 2 | 2,5 | 3 | 3,5 | 4 | 4 |
| | 14 | | | | | | | | 1 | 1,5 | 2 | 2,5 | 3 | 3 |
| | 15 | | | | | | | | | 0,5 | 1 | 1,5 | 2 | 2 |
| | 16 | | | | | | | | | | 0,5 | 1 | 1,5 | 1,5 |

Flash %

Fig.2

METHOD OF CONTROLLING THE CONTRAST BY REPRODUCTION SUCH AS SCREEN REPRODUCTION

The invention relates to a method of controlling the contrast by reproduction such as screen reproduction, e.g. screen reproduction of halftone pictures by means of a main exposure and an auxiliary exposure, whereby the density both in the lightest and the darkest field of the picture and consequently the contrast range of the halftone picture are first measured by means of a densitometer, whereafter the ratio of the lightest spot of the background chosen to the lightest spot of the original is measured and the main exposure is adjusted in response thereto, and then an exposure of a color wedge including the screen is performed and the maximum contrast range chosen to be used is measured, subsequently the auxiliary exposure is adjusted in response to the contrast and screen range of the halftone picture, the percentage of the auxiliary exposure in proportion to the main exposure depending on the contrast range and the screen range of the halftone picture in an unambiguous manner according to the formula $$\% \text{ flash} = \frac{-10^{-B} + 10^{-R}}{-10^{-B} + 1} \cdot 100\%$$

whereafter the halftone picture or the original in question may be exposed, the main exposure, however, being adjusted in such a manner that the sum of the main exposure and the auxiliary exposure remains substantially unchanged.

DE-OS No. 2,815,886 discloses a method of this type, whereby references to tables, however, are necessary in order to obtain the flash percentage.

The flash percentage may alternatively be obtained by means of a calculating unit, which, however, is relatively expensive.

The method according to the invention is characterized by adjusting a slider in a table on the basis of the screen range, said table indicating the flash percentage versus the screen range and the image range, whereby the flash percentage is measured automatically on the basis of a signal value corresponding to the image range.

References to tables are thereby avoided without using calculating units.

The invention will be described below with reference to the accompanying drawing, in which:

FIG. 1 illustrates a densitometer for carrying out the method according to the invention, and FIG. 2 illustrates a table of the flash percentage versus the image range and the screen range.

The method according to the invention is a further development of the method described in DE-OS No. 2,815,886, which is part of the present specification. According to this application the maximum contrast range R is read (i.e. the contrast range chosen to be used in response to the printing technique), and the auxiliary exposure, i.e. the flash percentage, is adjusted in response to the contrast range B of the halftone picture in question, since the percentage of the auxiliary exposure in proportion to the main exposure depends on the contrast range B and the screen range R of the halftone picture according to the formula $$\% \text{ flash} = \frac{-10^{-B} + 10^{-R}}{-10^{-B} + 1} \cdot 100\%$$

In this manner the auxiliary exposure may be determined in a simple manner in response to the sensitivity of the film and the form on the screen, whereby the entire contrast range is utilized and still all the information is maintained during reproduction. Furthermore the ratio of the lightest spot of the chosen background to the lightest spot of the original is measured and both the main and the auxiliary exposure are adjusted in response thereto. The invention thus provides a manner of performing this procedure automatically. Both the high light and the shadow value are measured by means of a densitometer, cf. FIG. 1, and a voltage corresponding to the difference is measured, e.g. by performing a zero position by means of the high light. The densitometer includes a scale 1 corresponding to the table illustrated in FIG. 2, in which table the flash percentage is calculated according to the above formula. A longitudinally displaceable slider 2 is adjusted in accordance with the screen range 2, i.e. the vertical axis of the table, whereby the voltage corresponding to the image range B, i.e. the horizontal axis of the table, then automatically exposes a field showing the flash percentage in question.

The densitometer operates according to the reflex principle.

If desired, a finder may be mounted on the underside of the densitometer. This finder may be extended in such a manner that the measuring in a high light field and a shadow field may be reliably performed.

A number of light diodes located behind the table may indicate each table value.

We claim:

1. A method of controlling the screen reproduction contrast of half-tone pictures by means of a main exposure and an auxiliary exposure, whereby the density both in the lightest and in the darkest field of the picture and consequently the contrast range of the halftone picture is first measured by means of a densitometer, whereafter the ratio of the lightest spot of the background chosen to the lightest spot of the original is measured and the main exposure is adjusted in response thereto, and then an exposure of a color wedge including the screen is performed and the maximum contrast range chosen to be used is measured, subsequently the auxiliary exposure is adjusted in response to the contrast and screen range of the halftone picture, the percentage of the auxiliary exposure in proportion to the main exposure depending on the contrast range and the screen range of the halftone picture in accordance with the formula $$\% \text{ flash} = \frac{-10^{-B} + 10^{-R}}{-10^{-B} + 1} \cdot 100\%$$

whereafter the halftone picture or the original in question may be exposed, the main exposure, however, being adjusted in such a manner that the sum of the main exposure and the auxiliary exposure remains substantially unchanged, characterized by the step of adjusting a slider along a table on the basis of the screen range (R), said table indicating the flash percentage calculated in accordance with said formula for progressively different values in the screen range (R) plotted against progressively different values in the image range (B), whereby the flash percentage is measured automatically on the basis of a signal value corresponding to the image range (B).

2. A method as claimed in claim 1, characterized by a light source for each table value being located behind the table and indicating said table value, if desired.

* * * * *